(12) United States Patent
Chen et al.

(10) Patent No.: US 12,721,182 B2
(45) Date of Patent: Aug. 25, 2026

(54) MICROELECTRONIC DEVICE PACKAGE INCLUDING INDUCTOR AND SEMICONDUCTOR DEVICE

(71) Applicant: TEXAS INSTRUMENTS INCORPORATED, Dallas, TX (US)

(72) Inventors: Jie Chen, Plano, TX (US); Rajen Maricon Murugan, Dallas, TX (US); Chittranjan Mohan Gupta, Richardson, TX (US); Yiqi Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 800 days.

(21) Appl. No.: 17/958,254

(22) Filed: Sep. 30, 2022

(65) Prior Publication Data

US 2024/0120297 A1 Apr. 11, 2024

(51) Int. Cl.

| | |
|---|---|
| ***H10W 44/20*** | (2026.01) |
| ***H02M 1/44*** | (2007.01) |
| ***H10D 1/20*** | (2025.01) |
| ***H10D 86/80*** | (2025.01) |

(52) U.S. Cl.

CPC .......... *H10W 44/20* (2026.01); *H10W 44/206* (2026.01); *H10W 44/216* (2026.01); *H10W 44/248* (2026.01)

(58) Field of Classification Search

CPC ........ H01L 23/66; H01L 23/645; H02M 1/44; H02M 3/003; H10D 1/20; H10D 86/80; H10D 80/211; H10W 44/20; H10W 44/206; H10W 44/216; H10W 44/248

See application file for complete search history.

(56) References Cited

U.S. PATENT DOCUMENTS

| | | | | |
|---|---|---|---|---|
| 2013/0093045 | A1* | 4/2013 | Cho | H10W 20/497 257/E21.575 |
| 2018/0366535 | A1* | 12/2018 | Chong | H01L 23/5227 |
| 2019/0164681 | A1* | 5/2019 | Kidwell, Jr. | H01L 23/5227 |
| 2019/0206812 | A1* | 7/2019 | Bonifield | H10W 44/601 |
| 2019/0252316 | A1* | 8/2019 | Zhang | H10W 20/497 |
| 2021/0193572 | A1* | 6/2021 | Liao | H10D 1/20 |

* cited by examiner

*Primary Examiner* — Omar F Mojaddedi

(74) *Attorney, Agent, or Firm* — Xiaotun Qiu; Frank D. Cimino

(57) ABSTRACT

An apparatus includes: a first conductor layer patterned into parallel strips having a first end and an opposite second end formed on a device side surface of a multilayer package substrate, the multilayer package substrate including conductor layers spaced from one another by dielectric material and coupled to one another by conductive vertical connection layers extending through the dielectric material; a second conductor layer in the multilayer package substrate spaced from the first conductor layer, the second conductor layer patterned into parallel strips having a first end and a second end, the second conductor layer coupled to the first conductor layer by vertical connectors formed of the conductive vertical connection layers at the first end and the second end, and a semiconductor die mounted to the device side surface of the multilayer package substrate that is spaced from and coupled to the second conductor.

17 Claims, 14 Drawing Sheets

FIG. 4A 508
507
5113
5112
5111
511
525
501
5171
517
521
5213
5212
5211
iCoil
iCoil
θ

521
5213
5212
5211
5123
5122
5121
5173
5172
5171
iCoil
5162
5161
5252
5251
525
517
θ

| | 751 VERTICAL INDUCTOR WITH THICKNESS OF 305 µm | | | 753 VERTICAL INDUCTOR WITH THICKNESS OF 505 µm | | | 755 SQUARE AIR CORE INDUCTOR | | |
|---|---|---|---|---|---|---|---|---|---|
| | PARASITIC R (m OHM) | L (nH) | Q | PARASITIC R (m OHM) | L (nH) | Q | PARASITIC R (m OHM) | L (nH) | Q |
| DC | 16.88 | 5.70 | | 17.32* | 8.79 | | 4.12 | 24.67 | |
| 10MHz | 33.61 | 5.31 | 9.92 | 36.09 | 8.31 | 14.46 | 68.04 | 19.63 | 18.12 |
| 100MHz | 107.16 | 4.98 | 29.19 | 112.52 | 7.95 | 44.37 | 238.10 | 18.78 | 49.53 |
| 400M | 217.83 | 4.89 | 56.43 | 226.88 | 7.86 | 87.03 | 487.48 | 18.59 | 95.79 |
| SPACE | 4.32mm^2*0.305mm | | | 4.32mm^2*0.505mm | | | 5.3mm^2*2mm | | |

FIG. 7

MICROELECTRONIC DEVICE PACKAGE INCLUDING INDUCTOR AND SEMICONDUCTOR DEVICE

TECHNICAL FIELD

This relates generally to microelectronic device packages, and more particularly to microelectronic device packages including inductors and semiconductor devices.

BACKGROUND

Processes for producing microelectronic device packages include mounting a semiconductor die to a package substrate, and covering the electronic devices with a dielectric material such as a mold compound to form packaged devices.

Incorporating inductors or coils with semiconductor devices in a microelectronic device package is desirable. DC-DC converters and other circuit modules based on integrated field effect transistors (FETs) integrated with other circuit elements in a microelectronics package are increasingly used. Particularly important for battery powered systems or for portable devices, a DC-DC converter can be critical to efficient power usage, system size and cost. Because DC-DC converters can use high frequency switching with pulse width modulation (PWM) or pulse frequency modulation (PFM) to produce the desired DC output signal, switching noise can be a problem when switching power converter devices are used. Passive filters that include coils or inductors can be used to address switching noise. However, mounting a discrete passive inductor or coil to a system board increases area and increases costs. Placing these elements in a module with an packaged integrated circuit also increases the size of the module and adds costs. These approaches require additional elements, including expensive printed circuit board (PCB) substrates, which are used with packaged semiconductor devices provided spaced apart from the coil or inductor devices. Forming microelectronic device packages including inductors or coils within the microelectronic device packages and packaged together with an integrated circuit remains challenging.

SUMMARY

In a described example, an apparatus includes: a first conductor layer patterned into parallel strips having a first end and an opposite second end formed on a device side surface of a multilayer package substrate, the multilayer package substrate including conductor layers spaced from one another by dielectric material and coupled to one another by conductive vertical connection layers extending through the dielectric material; a second conductor layer in the multilayer package substrate spaced from the first conductor layer, the second conductor layer patterned into parallel strips having a first end and a second end, the second conductor layer coupled to the first conductor layer by vertical connectors formed of the conductive vertical connection layers at the first end and the second end. A semiconductor die is mounted to the device side surface of the multilayer package substrate and is spaced from and coupled to the vertical inductor.

In an additional arrangement, a microelectronic device package includes: a multilayer package substrate having conductor layers spaced from one another by dielectric material, and comprising vertical connections extending through the dielectric material between the conductor layers and coupling portions of the conductor layers one to another, the multilayer package substrate having a device side surface and an opposite board side surface. A vertical inductor is formed including a coil formed in a first one of the conductor layers and a second one of the conductor layers that is spaced from the first one of the conductor layers, and having vertical connections formed of conductors extending through the dielectric material between the first one of the conductor layers and the second one of the conductor layers of the multilayer package substrate. Mold compound covers the vertical inductor and a portion of the device side surface of the multilayer package substrate.

An example method includes: patterning a first conductor layer in a multilayer package substrate to form parallel strips having a first end and a second end; forming vertical connections in the multilayer package substrate at the first end and the second end of the parallel strips of the first conductor layer, the vertical connections including conductors extending through a dielectric material of the multilayer package substrate; and patterning a second conductor layer in the multilayer package substrate that is spaced from the first conductor layer, the second conductor layer patterned into parallel strips having a first end and a second end, the parallel strips of the second conductor layer coupled to the parallel strips of the first conductor layer by the vertical connections to form a vertical inductor. The method further includes mounting a semiconductor die to a device side surface of the multilayer package substrate, coupling the semiconductor die to the vertical inductor; and covering the semiconductor die and a portion of the multilayer package substrate with mold compound.

BRIEF DESCRIPTION OF THE DRAWINGS

FIGS. 4A-4B illustrate, in a series of cross sectional views, the major steps in manufacturing a multilayer package substrate that can be used in the arrangements.

FIG. 7 illustrates, in a table, a comparison of two example vertical coils of the arrangements and a discrete coil component.

DETAILED DESCRIPTION

Figure 1A:
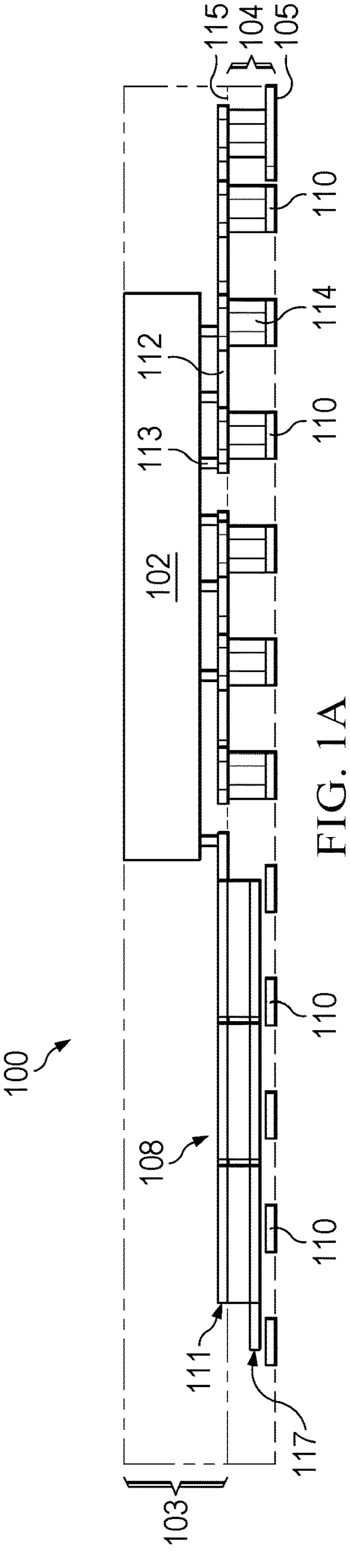
FIGS. 1A-1B illustrate, in a cross sectional view and a projection view, respectively, an example arrangement.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor die" is used herein. A semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, sensors, or active devices such as transistors. The semiconductor die can be an integrated circuit with hundreds or thousands of transistors coupled to form a functional circuit, for example a microprocessor or memory device.

The term "microelectronic device package" is used herein. A microelectronic device package has at least one semiconductor die electrically coupled to terminals, and has a package body that protects and covers the semiconductor die. The microelectronic device package can include additional elements, in some example arrangements an integrated inductor is included. Passive components such as sensors, antennas, capacitors, coils, inductors, and resistors can be included. In some arrangements, multiple semiconductor dies can be packaged together. For example, a power metal oxide semiconductor (MOS) field effect transistor (FET) semiconductor die and a logic semiconductor die (such as a gate driver die or a FET controller die) can be packaged together to from a single packaged electronic device. The semiconductor die is/are mounted to a package substrate that provides conductive leads. A portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. In flip chip package arrangements, the semiconductor die is mounted with bond pads on a device side surface facing the package substrate, and conductive posts or columns are formed on the bond pads extending from the semiconductor device, these conductive posts are mounted to and make electrical connection with conductive lands on the package substrate. The microelectronic device package can have a body formed by an epoxy mold compound ("EMC") which is a thermoset epoxy resin formed in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during the encapsulation process, these exposed lead portions provide the terminals for the semiconductor device package. No leads and leaded packages can be formed.

After molding, the individual packaged devices can be cut from each other in a sawing operation by cutting through the mold compound and package substrate in saw streets formed between the devices. Portions of the package substrate leads are exposed from the mold compound package to form terminals for the packaged semiconductor device.

The term "package substrate" is used herein. A package substrate is a substrate arranged to receive a semiconductor die and to support the semiconductor die in a completed semiconductor device package. Package substrates can include conductive lead frames, which can be formed from copper, aluminum, stainless steel, steel and alloys such as Alloy 42 and copper alloys. The lead frames can include a die pad with a die side surface for mounting a semiconductor die, and conductive leads arranged near and spaced from the die pad for coupling to bond pads on the semiconductor die using wire bonds, ribbon bonds, or other conductors. The lead frames can be provided in strips or arrays. The conductive lead frames can be provided as a panel with strips or arrays of unit device portions in rows and columns. Semiconductor dies can be placed on respective unit device portions within the strips or arrays. A semiconductor die can be placed on a die pad for each packaged device, and die attach or die adhesive can be used to mount the semiconductor dies to the lead frame die pads. In wire bonded packages, bond wires can couple bond pads on the semiconductor dies to the leads of the lead frames. The lead frames may have plated portions in areas designated for wire bonding, for example silver plating can be used. After the bond wires are in place, a portion of the package substrate, the semiconductor die, and at least a portion of the die pad can be covered with a protective material such as a mold compound.

The term "multilayer package substrate" is used herein. A multilayer package substrate is a substrate that has multiple conductor layers including conductive traces, and which has vertical conductive connections extending through dielectric material between the conductive trace layers. In an example arrangement, a multilayer package substrate is formed by plating a patterned conductor level and then covering the conductor with a layer of dielectric material. Grinding, etching or thinning can be performed on the dielectric material to expose portions of the layer of conductors. Additional plating layers can be formed to add additional levels of conductors, some of which are coupled to the prior layers by vertical connectors extending through dielectric material, and additional dielectric material can be deposited at each level and can cover the conductors. By using an additive or build up manufacturing approach, and by performing multiple plating steps, dielectric forming steps, and grinding steps, a multilayer package substrate is formed with an arbitrary number of layers. In an example arrangement, copper conductors are formed by plating, and a film dielectric material can be used as the dielectric material.

The term "scribe lane" is used herein. A scribe lane is a portion of semiconductor wafer between semiconductor dies. Sometimes the term "scribe street" is used. Once semiconductor processing is completed and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser or other cutting tool to pass between the molded electronic devices to separate the devices from one another. This process is another form of singulation. When the molded electronic devices are provided in a strip with one device adjacent another device along the strip, the saw streets are parallel and normal to the length of the strip. When the molded electronic devices are provided in an array of devices in rows and columns, the saw streets include two groups of parallel saw streets, the two groups are normal to each other and the saw will traverse the molded electronic devices in two different directions to cut apart the packaged electronic devices from one another in the array.

The term "quad flat no-lead" (QFN) is used herein for a type of electronic device package. A QFN package has conductive leads that are coextensive with the sides of a molded package body, and in a quad package the leads are on four sides. Alternative flat no-lead packages may have leads on two sides or only on one side. These can be referred to as small outline no-lead or SON packages. No-lead packaged electronic devices can be surface mounted to a board. Leaded packages can be used with the arrangements where the leads extend away from the package body and are shaped to form a portion for soldering to a board.

The term "vertical inductor" is used herein. A vertical inductor is formed from conductor material at different levels in a multilayer package substrate, with vertical connections formed between the conductor levels, the vertical inductor can be formed as continuous coil from an input terminal to an output terminal. In example arrangements, the vertical inductor forms a rectangle or square shape in a cross section taken through the conductor levels, and the continuous coil surrounds a central core of a dielectric material. The vertical inductor is formed of conductor materials at two conductor levels spaced apart and the conductor materials are coupled to form a two terminal device. In contrast to the vertical inductors of the arrangements, a planar inductor can be formed of portions of conductor material in a single plane, however this approach takes additional device area when compared to the vertical inductors of the arrangements.

In the arrangements, coil portions are formed on two different conductor levels and spaced from one another, and vertical conductor connections between the coil portions at the two levels couple the portions to form the continuous coil, so that current flows from an input terminal through each of the conductor portions in series, and then to an output terminal. In the arrangements the vertical inductor is formed in a multilayer package substrate, with a portion for mounting a semiconductor die on a surface of the multilayer package substrate adjacent to or proximate to the inductor. Conductor traces can couple the vertical inductor to the semiconductor die so that a microelectronic device package is efficiently formed including the vertical inductor and the semiconductor die coupled together in a circuit. In an example, the vertical inductor has the package substrate dielectric material in the core. In an alternative arrangement, magnetic mold compound material can be used for forming the multilayer package substrate and the core will be of the magnetic mold compound material.

In the arrangements, a microelectronic device package includes a semiconductor die mounted to a multilayer package substrate. The multilayer package substrate has a device side surface, a semiconductor die mounted on a die mount portion of the device side surface, and a vertical inductor formed spaced from the die mount portion. In an example arrangement the semiconductor die will be mounted beside, or side by side, with respect to a vertical inductor. In the multilayer package substrate, the vertical inductor is a coil that can be formed in conductive layers with one layer at or near the device side surface of the multilayer package substrate, for example as a patterned plated conductor layer of the multilayer package substrate. Another layer of the multilayer package substrate can be connected to the plated conductor layer beneath the device side surface of the package substrate, to increase component density and to reduce the device size. A semiconductor die mounted to the device side surface of the multilayer package substrate can be coupled to the coil by conductive traces formed in conductor layers of the multilayer package substrate. In one example, the semiconductor die is flip chip mounted to the multilayer package substrate. In an alternative example, a semiconductor die mounted facing away from the device side surface of the multilayer package substrate and is wire bonded to conductive traces on the multilayer package substrate. Additional passive elements such as resistors and capacitors can be formed in the multilayer package substrate, or mounted to the multilayer package substrate.

The semiconductor die used in the arrangements can be a switching power converter device. Switching power converters can be used for DC-DC converters, which are increasingly used for portable and battery powered devices, and for use in automotive and vehicular systems where the primary electric power is a battery at one voltage, and a subsystem requires a different DC voltage. The semiconductor die can be provided as multiple semiconductor dies or as components mounted to the multilayer package substrate, to form a system. For example, a power FET semiconductor die and a power FET gate driver semiconductor die can be mounted as separate semiconductor dies on the multiple layer package substrate, with the vertical inductor coupled to the power FET semiconductor die. Additional passive components can be mounted to the multilayer package substrate.

Figure 1B:
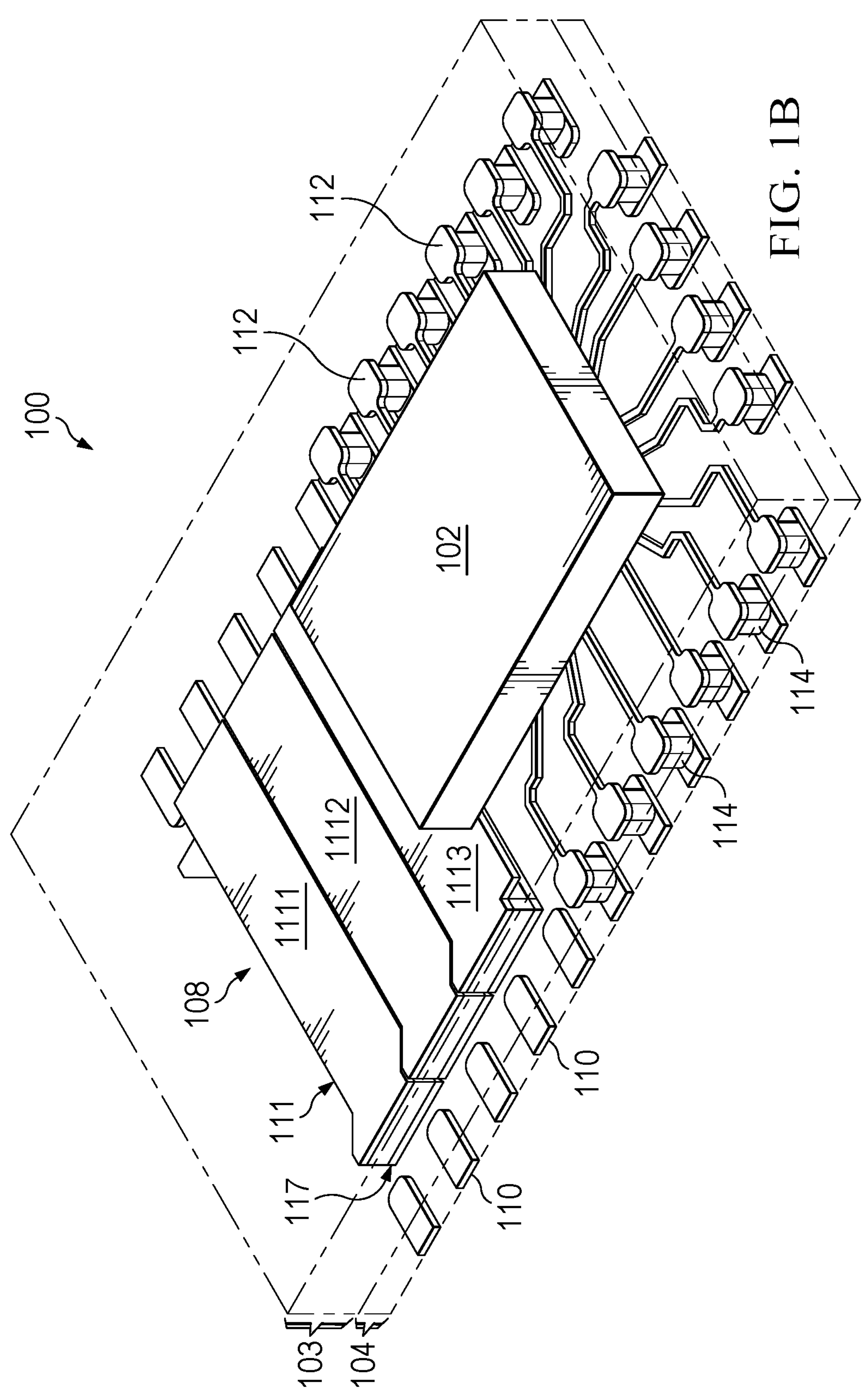

FIGS. 1A-1B illustrate example arrangements. FIG. 1A illustrates, in a cross sectional view, a microelectronic device package 100. In the example arrangement illustrated in FIGS. 1A-1B the package is a quad flat no lead (QFN) package. QFN packages are one type of microelectronic device package that is useful with the arrangements. Other package types including leaded packages and no lead packages are useful with the arrangements. The microelectronic device package 100 includes a multilayer package substrate 104. Terminals 110 are formed of a conductor material on a board side surface 105 (the bottom surface of the multilayer package substrate 104 as the arrangement is oriented in FIG. 1A) of the microelectronic device package 100. Vertical connectors 114 extend from terminals 110 through layers of dielectric material of the multilayer package substrate 104 to a device side surface 115 of the multilayer package substrate 104, where leads 112 are formed of conductors of a conductive layer of the multilayer package substrate. A semiconductor die 102 is mounted to the device side surface 115 of the multilayer package substrate 104. The semiconductor die 102 in the illustrated example is flip chip mounted, so that a device side surface of the semiconductor die 102 is oriented facing the device side surface of the multilayer package substrate 104. Conductive post connects 113 extend from the semiconductor die 102 to leads 112 and make electrical and mechanical connections between semiconductor die 102 and multilayer package substrate 104. Solder can be used to mount the semiconductor die 102 to the multilayer package substrate 104, for example a solder reflow process can be used.

A vertical inductor 108 is formed of a first conductor layer 111 and a second conductor layer 117 of the multilayer package substrate 104. The first conductor layer 111 can be coupled to the semiconductor die 102 by conductive post connects 113 mounted to leads 112. The device side surface 115 of the multilayer package substrate 104 and the semiconductor die 102 are covered with mold compound 103. The vertical inductor 108 includes a second conductor layer 117 that is formed in another conductor layer of the multilayer package substrate 104, and is positioned beneath the device side surface 115 of the multilayer package substrate 104 (as the elements are oriented in FIG. 1A), and the second conductor layer 117 is formed closer to or at the board side surface 105 of the multilayer package substrate 104. Vertical connections extend between the two conductor layers 111, 117 to connect the conductor portions of the vertical inductor 108 formed in the two layers.

In FIG. 1B, the microelectronic device package 100 of FIG. 1A is illustrated in a projection view with the mold compound 103 shown in a transparent view to expose the other elements. Mold compound 103 is shown covering the device side surface 115 of the multilayer package substrate 104, and surrounding and protecting the semiconductor die 102 and the device side surface of the multilayer package substrate 104. Terminals 110 on the board side surface 105 are configured for mounting to a system board, for example a printed circuit board. Leads 112 formed on the device side surface 115 of the multilayer package substrate 104 can be formed of the same material as the first level conductor 106, for example, copper, gold, aluminum, silver, or an alloy of these. Protective plating layers such as palladium, nickel, gold, silver or multiple layers of these can be formed on the conductors such as first conductor layer 111. In the illustrated example of FIG. 1B, semiconductor die 102 is flip chip mounted to the device side surface 115 of the multilayer package substrate 104, and has conductive post connects (not visible in FIG. 1B, see FIG. 1A) extending from bond pads of the semiconductor die 102 that are bonded using solder bumps to the device side surface of the multilayer package substrate 104. Mold compound (or another protective material) 103 is shown overlying the vertical inductor 108 and surrounding the semiconductor die 102.

The vertical inductor 108 includes the conductor at first conductor layer 111 patterned into parallel strips 1161, 1162, and 1163. More or fewer strips can be used. The parallel strips are coupled to corresponding parallel strips (not visible in the projection of FIG. 1B) in first conductor layer 111, and coupled by vertical connections (not visible in the projection of FIG. 1B) to form a continuous coil with two terminals.

As an additional alternative arrangement (not shown), the semiconductor die 102 can be mounted to the multilayer package substrate 104 in a "face up" position with bond pads facing away from the device side surface of the multilayer package substrate, and wire bonds or ribbon bonds can be used to couple the bond pads to the multilayer package substrate and to the vertical inductor.

Although not shown in FIGS. 1A-1B for simplicity of explanation, additional components such as passives or additional semiconductor devices can be mounted to the device side surface of the multilayer package substrate 104. Leads 112 are formed on the device side surface of the multilayer package substrate 104 and couple the semiconductor die 102 to terminals 110 by conductors 114 formed of the conductive layers of the multilayer package substrate 104 that extend through dielectric material to the terminals 110.

The dielectric material of the multilayer package substrate 104 can be a thermoplastic or a thermoset material. An example thermoplastic material is Ajinomoto Build up Film (ABF) which is commercially available from the Ajinomoto Co. Ltd of Tokyo Japan. ABF substrates can be formed with a built up process where printed or plated conductors are formed on laminated layers, by repeatedly plating and laminating steps, an arbitrary number of layers can be formed. Alternative thermoplastics include ABS (Acrylonitrile Butadiene Styrene) and ASA (Acrylonitrile Styrene Acrylate), other dielectrics can be used such as thermoset mold compound including epoxy resin, epoxies, resins, or plastics can be used. Mold compound including magnetic mold compound materials can be used to form the multilayer package substrate. A mold compound 103 is shown overlying the vertical inductor 108, and protecting the semiconductor die 102. Mold compound 103 can be a thermoset mold compound of epoxy resin, another epoxy, a resin, or plastic can be used. A covering or cap can be used as an alternative to mold compound 103.

The arrangement shown in FIGS. 1A-1B can be formed using additive manufacturing, or build up processing, to form the multilayer package substrate 104 including the vertical inductor 108. As is further described below, by using a series of plating, molding, and grinding steps, successive layers of trace level conductors, vertical conductor connections, and dielectric material can be formed, and these steps can be repeated to form the multilayer package substrate 104. The vertical inductor 108 can be formed by forming a pattern on a rectangular portion of the first conductor layer (111, for example) and by forming a pattern on a rectangular portion of the second conductor layer (117, for example), these can be connected by vertical connections. Because the vertical connections are formed using an additive process, and then dielectric material is molded over the vertical connections, the need for drilling precise via holes such as are used in printed circuit board construction, and the need to plate or fill the via holes with conductors, such as are used in printed circuit board substrates, is eliminated, so the multilayer package substrate is cost effective (when compared to organic substrates such as printed circuit boards.) The vertical connections can be formed in various sizes and shapes, unlike the vias of a circuit board, and can be formed between trace conductor layers spaced apart by patterning the vertical connectors and the trace conductor layers at each of the intervening layers in a similar shape, to form a connected vertical stack of conductor materials. By mounting the semiconductor die 102 on the multilayer package substrate spaced from and coupled to the vertical inductor 108 using existing flip chip mounting (or, in an alternative, by using wire bond connections), a reliable and cost effective microelectronic device package including an inductor and a semiconductor die or multiple die is provided by use of the arrangements. While certain shapes for the vertical inductor 108 are shown as examples to illustrate the arrangements, other shapes and sizes can be used.

In the arrangements, a semiconductor device is mounted to a device side surface of a multilayer package substrate. In forming the arrangements, the semiconductor devices can be formed independently of the multilayer package substrate, so that methods for forming the semiconductor device, and for forming the multilayer package substrate, can be performed at different times, and at different locations. The components can be assembled together to complete the arrangements. For example the vertical inductor and the multilayer package substrates can be formed at a facility for making package substrates, while the semiconductor die can be formed at a semiconductor device manufacturing facility, and these components can be assembled at a later time.

Figure 2A:
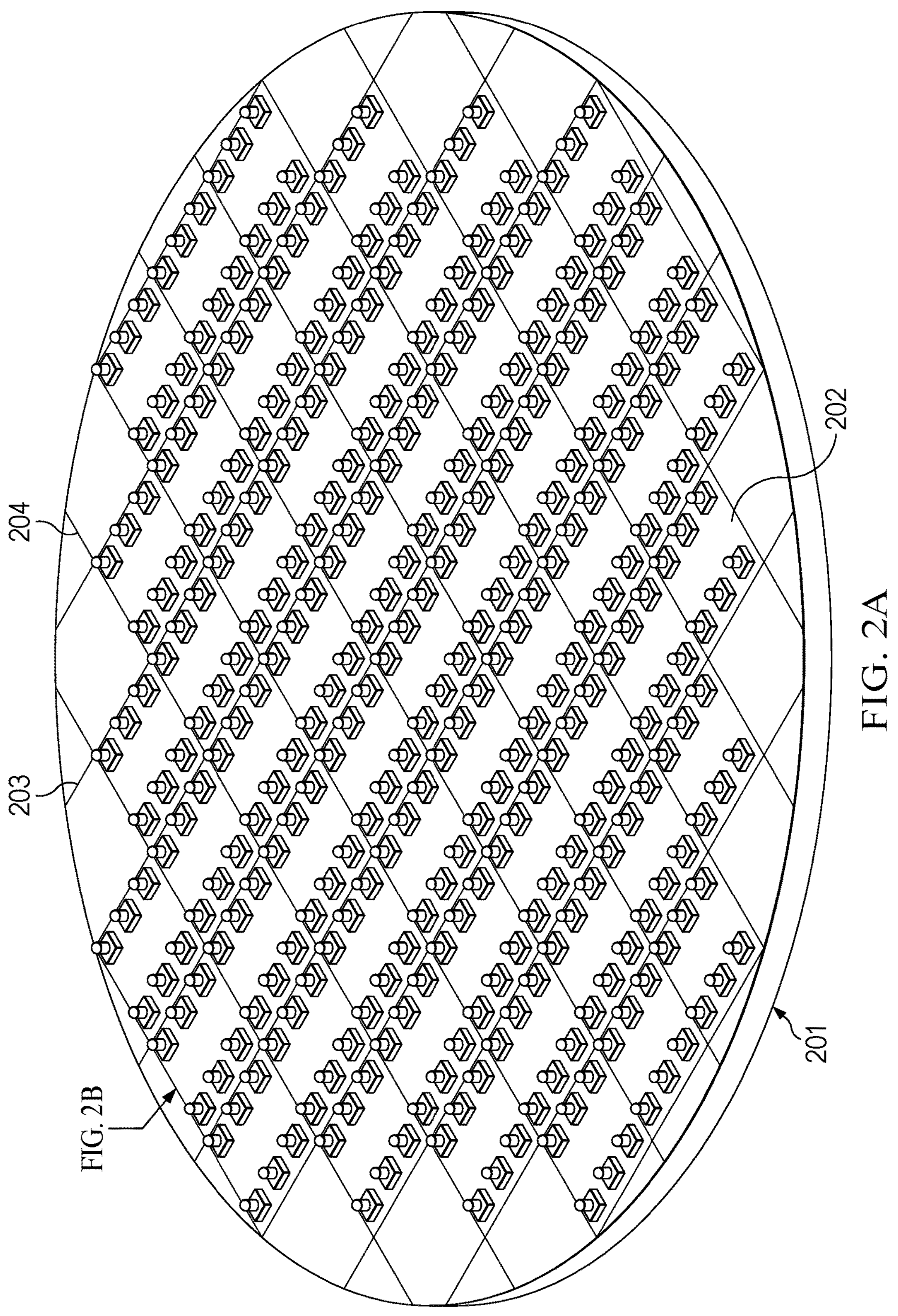
FIGS. 2A-2B illustrate, in a projection view and a close up projection view, respectively, semiconductor dies on a semiconductor wafer, and an individual semiconductor die from the semiconductor wafer for use with the arrangements.
Figure 2B:
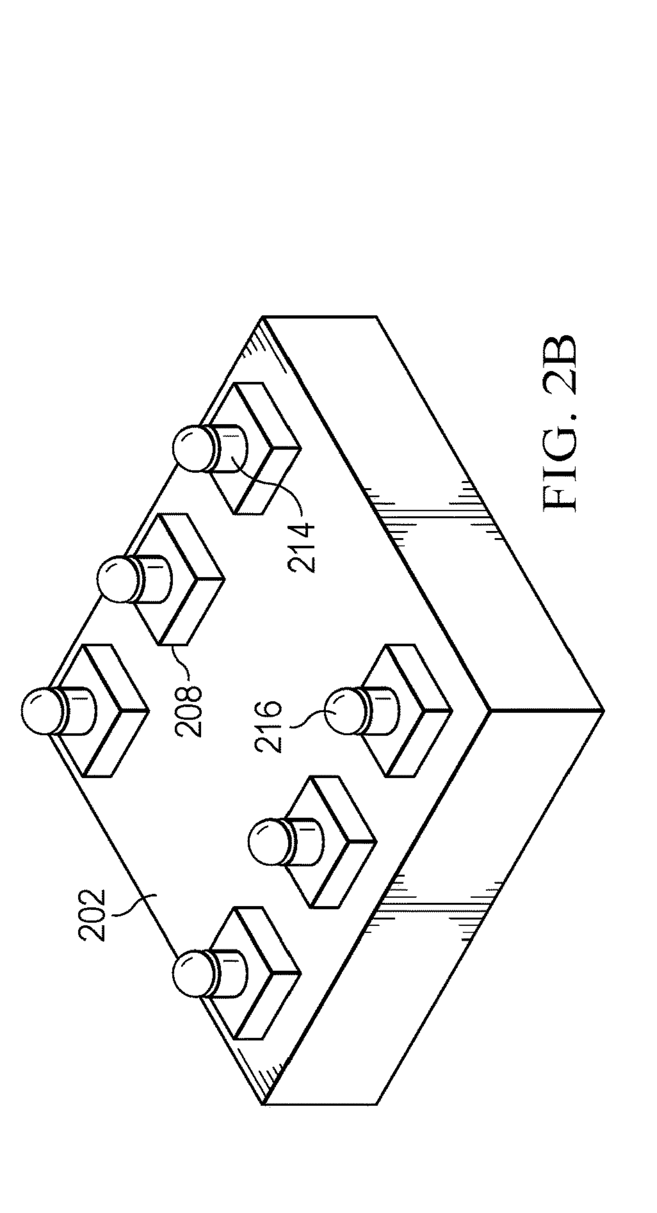

FIGS. 2A and 2B illustrate in two projection views a semiconductor wafer 201 having semiconductor devices formed on it configured for flip chip mounting, and an individual semiconductor die 202 from the wafer for flip chip mounting, respectively. In FIG. 2A, a semiconductor wafer 201 is shown with an array of semiconductor dies 202 formed in rows and columns on a surface. The semiconductor dies 202 can be formed using processes in a semiconductor manufacturing facility, including ion implantation, substrate doping, anneals, oxidation, dielectric and metal deposition, sputter, photolithography, pattern, etch, strip, chemical mechanical polishing (CMP), electroplating, and other processes for making semiconductor devices. Scribe lanes 203 and 204, which are perpendicular to one another and which run in parallel groups across the wafer 201, separate the rows and columns of the completed semiconductor dies 202, and provide areas for dicing the wafer 201 so as to separate the semiconductor dies 202 from one another.

FIG. 2B illustrates a single semiconductor die 202, with bond pads 208, which are conductive pads that are electrically coupled to devices (not shown) formed in the semiconductor die 202. Conductive post connects 214 are shown extending away from a proximate end mounted on the bond pads 208 on the surface of semiconductor die 202 to a distal end, and solder bumps 216 are formed on the distal ends of the conductive post connects 214. The conductive post connects 214 can be formed by electroless plating or by electroplating. In an example, the conductive post connects 214 are copper pillar bumps. Copper pillar bumps can be formed by sputtering a seed layer over the surface of the semiconductor wafer 201, forming a photoresist layer over the seed layer, using photolithography to expose the bond pads 208 in openings in the layer of photoresist, plating the copper conductive post connects 214 on the bond pads, and plating a lead solder or a lead-free solder such as an tin, silver (SnAg) or tin, silver, copper (SnAgCu) or SAC solder to form solder bumps 216 on the distal ends of the copper conductive post connects 214. In an alternative approach, solder bumps or particles may be dropped onto the distal ends of the copper pillar bumps and then reflowed in a thermal process to form solder bumps. Other conductive materials can be used for the conductive post connects in an electroplating or electroless plating operation, including gold, silver, nickel, palladium, or tin, for example. Not shown for clarity of illustration are under bump metallization (UBM) portions which can be formed over the bond pads to improve plating and adhesion between the conductive post connects 214 and the bond pads 208. After the plating operations, the photoresist is then stripped, and the excess seed layer is etched from the surface of the wafer 201. The semiconductor dies 202 are then separated by dicing, or are singulated, using the scribe lanes 203, 204 (see FIG. 2A).

Figure 3:
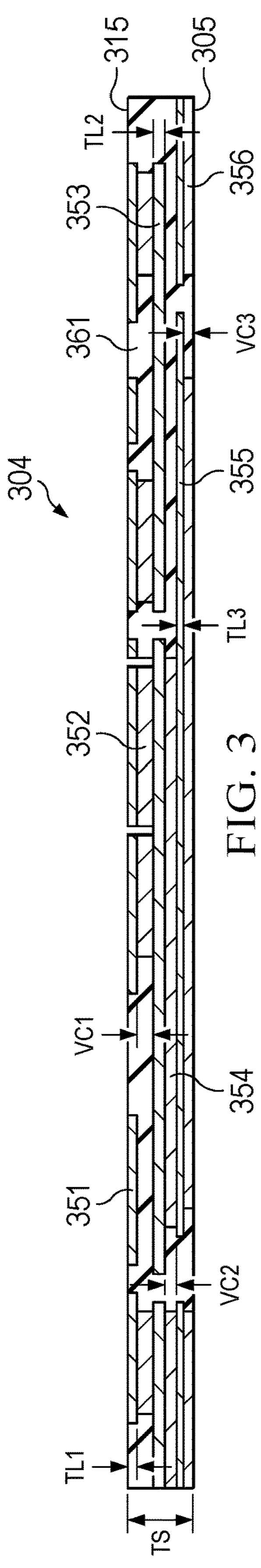
FIG. 3 illustrates, in a cross sectional view, a multilayer package substrate for use with the arrangements.

FIG. 3 illustrates in a cross sectional view a multilayer package substrate 304 that can be used with the arrangements. In FIG. 3, the multilayer package substrate 304 has a device side surface 315 and a board side surface 305. Three trace conductor layers 351, 353, 355 are formed spaced from one another by dielectric material 361, the trace conductor layers are patterned for making horizontal connections, and three vertical conductor layers 352, 354, 356 form electrical connections between the three trace layers 351, 353, 355 and extend through the dielectric material 361 that is disposed over and between the trace layers. The dielectric material 361 can be a thermoplastic material such as ABF, an alternative such as ABS or ASA, or can be a thermoset material, such as epoxy resin mold compound (EMC). In one example a magnetic mold compound is used, such as a polymer based magnetic compound for injection molding commercially available from HAWA-Magnetische und leitfahige Werkstoffe, of Monheim Germany. Additional magnetic compounds that can be used are commercially available from MATE Co., Ltd., of Okayama, Japan.

In one example the multilayer package substrate 304 has a substrate thickness labeled "TS" of 305 microns. In an alternative the multilayer package substrate has a substrate thickness of 505 microns, and additional package substrate thicknesses from 150-800 microns can be used. In the 305 micron thick example illustrated, the first trace layer, 351, near the device side surface 315 of the multilayer package substrate, has a trace layer thickness labeled TL1 of 15 microns. The first vertical conductor layer, 352, has a thickness labeled VC1 of 25 microns. The second trace layer, 353, sometimes coupled to the first trace layer 351 by the first vertical connection layer 352, has a thickness labeled TL2 of 60 microns. The second vertical connection layer, 354, has a thickness labeled VC2 of 65 microns. The third trace layer, 355, has a thickness labeled TL3 of 15 microns, and the third vertical connection layer, 356, has a thickness labeled VC3 of 25 microns. Additional layers, such as conductive lands on the device side surface 315, or terminals on the board side surface 305, may be formed by plating (not shown in FIG. 3). A continuous vertical connection between the device side surface 315 and the board side surface 305 can be formed by patterning a stack of trace layers and by patterning the corresponding vertical connection layers to form a continuous conductive path extending through the dielectric material 361.

In the arrangements, a vertical inductor can be formed by patterning the first trace layer (351 in this example) and by patterning the third trace layer (355 in this example). These trace layers can be connected by patterning vertical connections, and patterning the intervening conductor layers, to form a vertical conductor stack between the first trace layer and the third trace layer. A semiconductor device mounting area positioned spaced from the inductor, can be formed by patterning the first trace layer 351. Note that in this description, the vertical connection layers 352, 354, and 356 are not described as "vias" to distinguish the vertical connections of the multilayer package substrates of the arrangements from the vertical via connections of PCBs or other circuit board substrates, which are filled or plated vias in formed via holes. The vertical connections of the arrangements are formed using additive manufacturing, while vias in PCBs are usually formed by removing material, for example holes are drilled into the substrate. These via holes between conductor layers then must be plated and then filled with a conductor, which requires additional plating steps after the drilling steps. These additional steps are precise manufacturing processes that add costs and require additional manufacturing tools and capabilities. In contrast the vertical connection layers used in the multilayer package substrates of the arrangements are formed in the same plating processes as the process used in forming the trace layers, simplifying manufacture, and reducing costs. In addition the vertical connection layers in the arrangements can be arbitrary shapes, such as rails, columns, or posts, and the rails can be formed in continuous patterns to form electric shields, tubs, or tanks, and can be coupled to grounds or other potentials, isolating regions of the multilayer package substrate from one another. Noise reduction and the ability to create electrically isolated portions of the multilayer package substrate can be enhanced by use of the vertical connections to form tanks, shields, and tubs. Thermal performance of the microelectronic device packages of example arrangements can be improved by use of the vertical connection layers to form thermally conductive columns, sinks or rails that can be coupled to thermal paths on a system board to increase thermal dissipation from the semiconductor devices mounted on the multilayer package substrate. In some example arrangements, an optional added vertical connection is placed next to the vertical stack to reduce current crowding at a corner where a horizontal trace conductor layer meets a vertical connection. Adding additional conductor material at the transition area reduces current crowding effects and improves performance of the vertical inductor.

In the arrangements, vertical connections in a vertical coil are formed by patterning the vertical connection layers and the trace connection layers at the ends of a coil pattern to form vertical connectors that extend from a conductor layer at a first level in the multilayer package substrate to a lower conductor layer closer to the board side surface. In this way, the vertical inductor formed in the arrangements has a rectangular cross section with the gap between the trace conductors filled with dielectric material. In an alternative arrangement, the gap between the trace conductors can be formed of another material, such as a ferromagnetic material that can be used.

Figure 4A:
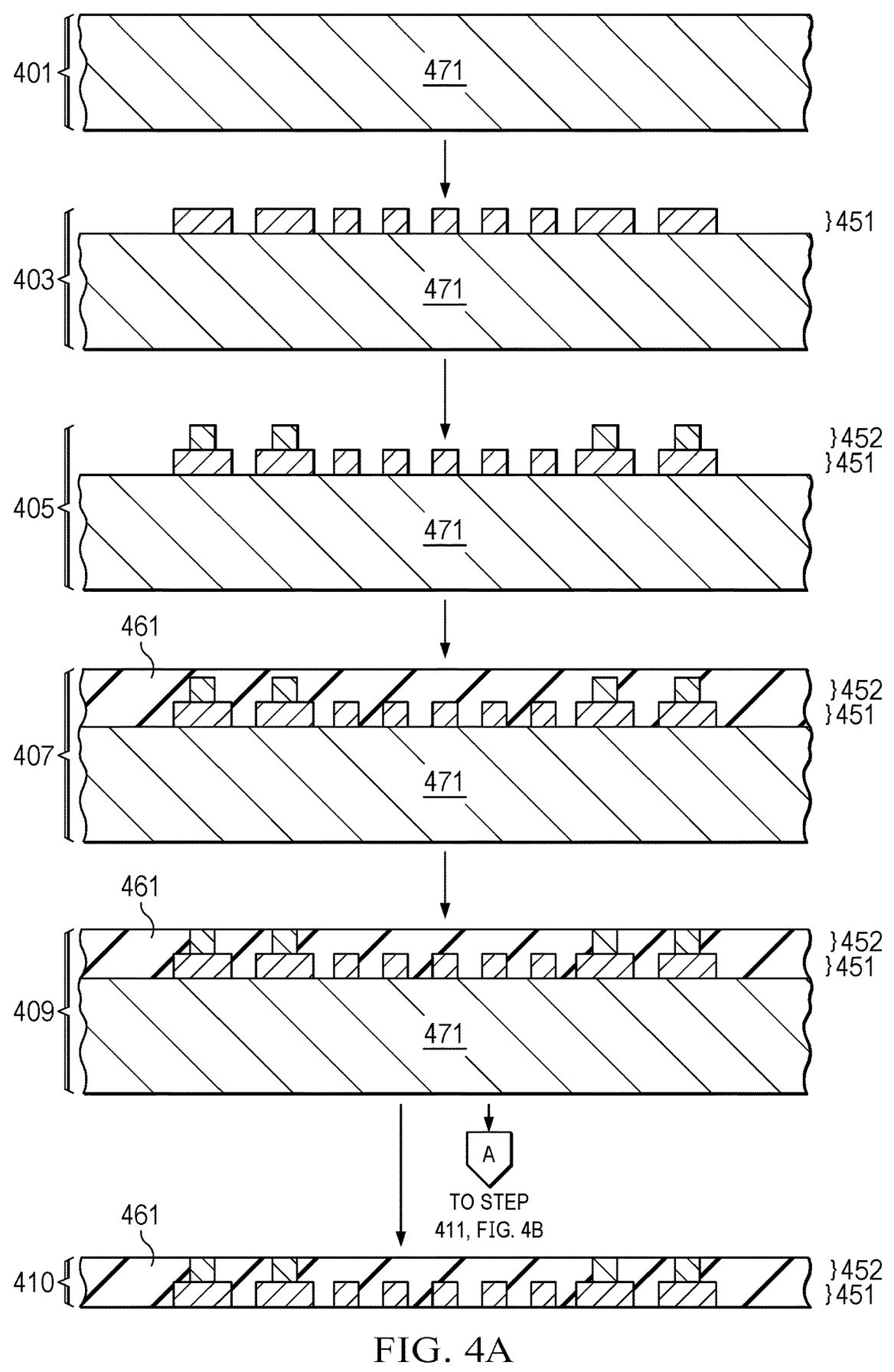
Figure 4B:
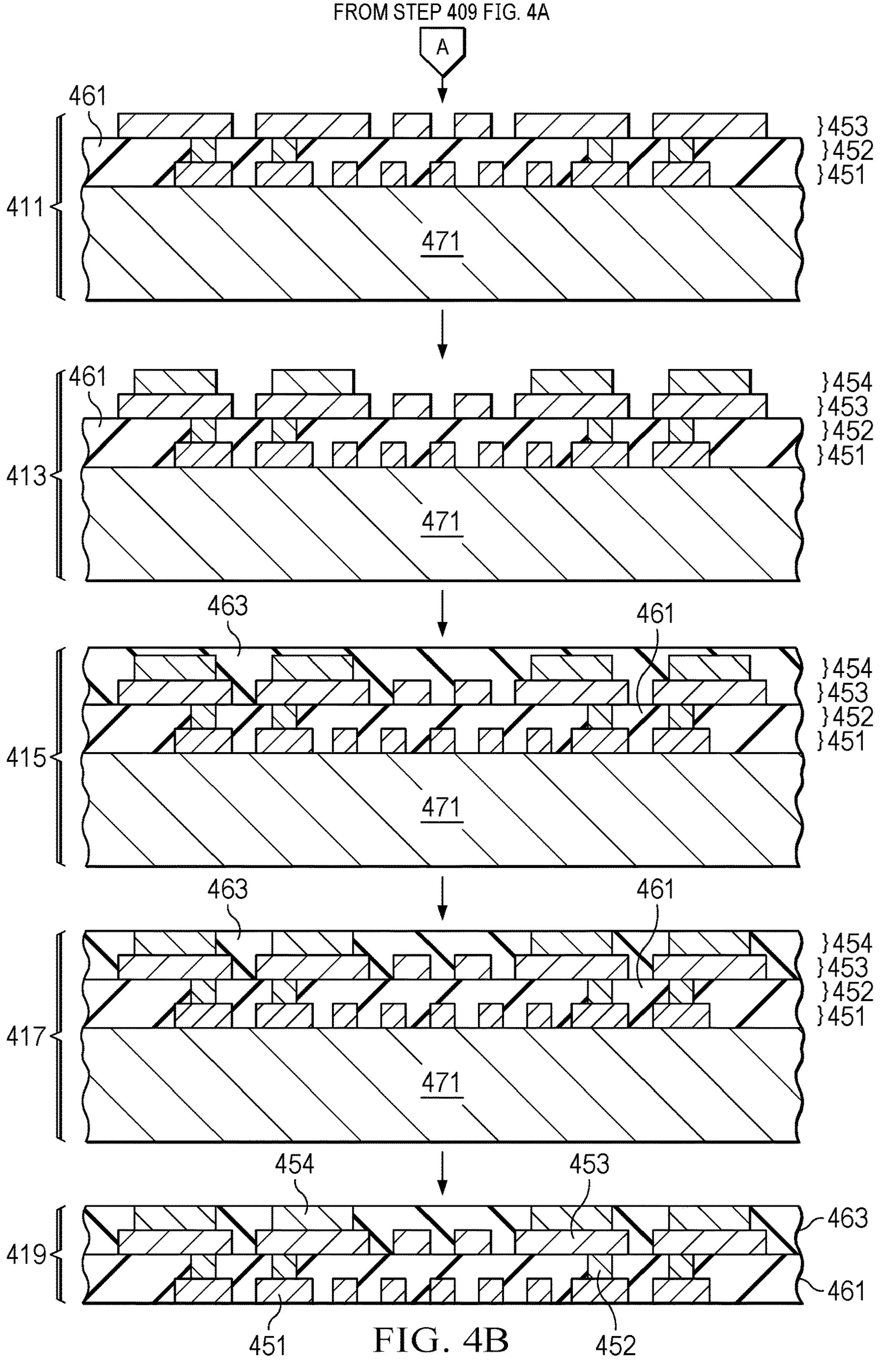

FIGS. 4A-4B illustrate, in a series of cross sectional views, selected steps for a method for forming a multilayer package substrate that is useful with the arrangements. In FIG. 4A, at step 401, a carrier 471 is readied for a plating process. The carrier 471 can be stainless steel, steel, aluminum or another material that will support the multilayer package substrate layers during plating and molding steps, the multilayer package substrate is then removed, and the carrier 471 can be cleaned for further use in additional manufacturing processes. Alternatively the carrier 471 can be discarded.

At step 403, a first trace layer 451 is formed by plating. In an example process, a seed layer is deposited over the surface of the metal carrier 471, by sputtering, chemical vapor deposition (CVD) or other seed layer deposition step. A photoresist layer is deposited over the seed layer, exposed, developed and cured to form a pattern to be plated. Electroless or electroplating is performed using the exposed portions of the seed layer to start the plating, forming a pattern according to patterns in the photoresist layer.

At step 405, then plating process continues. A second photoresist layer is deposited, exposed, and developed to pattern the first vertical connection layer 452. By leaving the first photoresist layer in place, the second photoresist layer is used without an intervening photoresist strip and clean step, to simplify processing. The first trace layer 451 can be used as a seed layer for the second plating operation, to further simplify processing.

At step 407, a first dielectric deposition operation is performed. The first trace layer 451 and the first vertical connection layer 452 are covered in a dielectric material. In an example a dielectric film such as ABF is used, alternatively another thermoplastic material is used, in an example ABS is used; in alternative examples ASA can be used, or a thermoset epoxy resin mold compound can be used, or resins, epoxies, or plastics can be used. In an example compressive molding operation, a mold compound can be heated to a liquid state, forced under pressure through runners into a mold to cover the first trace layer 451 and the first vertical connection layer 452, and subsequently cured to form solid dielectric layer 461. Anneals or cures can be performed to harden the dielectric for further processing.

At step 409, a grinding operation performed on the surface of the dielectric layer 461 exposes a surface of the vertical connection layer 452 and provides conductive surfaces for mounting devices, or for use in additional plating operations. If the multilayer package substrate is complete, the method ends at step 410, where a de-carrier operation removes the metal carrier 471 from the dielectric layer 461, leaving the first trace layer 451 and the first vertical connection layer 452 in a dielectric material 461, providing a package substrate.

In examples where additional trace layers and additional vertical connection layers are needed, the method continues, leaving step 409 and transitioning to step 411 in FIG. 4B.

At step 411, a second trace layer 453 is formed by plating using the same processes as described above with respect to step 405. A seed layer for the plating operation is deposited and a photoresist layer is deposited and patterned, and the plating operation forms the second trace layer 453 over the dielectric material 461, with portions of the second trace layer 453 electrically connected to the first vertical connection layer 452.

At step 413, a second vertical connection layer 454 is formed using an additional plating step on the second trace layer 453. The second vertical connection layer 454 can be plated using the second trace layer 453 as a seed layer, and without the need for removing the preceding photoresist layer, simplifying the process.

At step 415, a second dielectric layer is formed to cover the second trace layer 453 and the second vertical connection layer 454 in a layer of dielectric material 463. The multilayer package substrate at this stage has a first trace layer 451, a first vertical connection layer 452, a second trace layer 453, and a second vertical connection layer 454, portions of the layers are electrically connected together to form vertical paths through dielectric layers 461 and 463.

At step 417, dielectric layer 463 is mechanically ground in a grinding process or chemically etched to expose a surface of the second vertical connection layer 454. At step 419 the example method ends by removing the metal carrier 471, leaving a multilayer package substrate including the conductor layers 451, 452, 453 and 454 in dielectric layers 461, 463. The steps of FIGS. 4A-4B can be repeated to form multilayer package substrates for use with the arrangements having more layers, by performing plating of a trace layer, plating of a vertical connection layer, forming a dielectric layer or layers, and grinding or etching the dielectric layers, repeatedly.

Figure 5A:
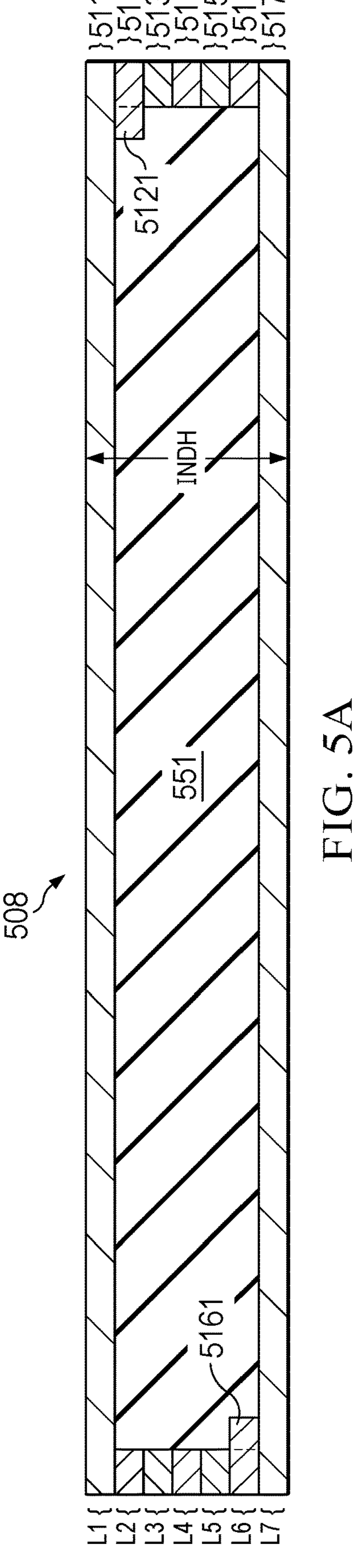
FIGS. 5A-5D illustrate, in a cross sectional view, a plan view, a projection view, and an additional partial projection view, a vertical inductor for use in the arrangements.

FIG. 5A illustrates, in a cross sectional view, a vertical inductor 508 for use with an arrangement. In FIG. 5A, vertical inductor 508 is formed using a first conductor layer 511 and a second conductor layer 517 of a multilayer package substrate. For example, copper, aluminum, or gold layers can be used. The conductor layers can be formed as layers on a multilayer package substrate, as shown in FIGS. 1A-1B. In an example the vertical inductor 508 is configured for use as part of a switching noise filter for a DC-DC converter. In alternative arrangements, the vertical inductor 508 can be varied in dimensions to configure the inductor for other applications.

As shown in FIG. 5A, the vertical inductor 508 has a conductor layer 511 formed at a first level (labeled L1) in the multilayer package substrate, and a seventh conductor layer 517 (labeled L7) formed beneath the first conductor layer 511 and spaced from it. The multilayer package substrate used for the vertical inductor 508 has seven layers, although more or less layers can be used. The first layer 511, labeled L1, is a conductor layer that forms the upper part of the vertical inductor 508. The second layer 513, labeled L2, is a vertical connection layer. In the example arrangement, a portion of the layer L2 is used to form an additional corner connector 5121 for the vertical connection, this corner connection helps improve performance by eliminating current crowding as the current flows through the vertical connection and to the trace level conductor 511. The vertical connections include a portion of a second conductor layer 513, labeled L3. The vertical connections include portion of a second vertical conductor layer 514 labeled L4. The vertical connection includes portions of a third trace level conductor 515, and of a third vertical conductor layer 516, labeled L5 and L6, respectively, in FIG. 5A. The bottom layer of the vertical inductor 508 is formed of the seventh conductor layer 517, labeled L7. The vertical conductor layer 516 includes an additional portion 5161 that is placed in the corner between the vertical connection and the bottom conductor layer 517 and also reduces current crowding between the vertical connection and the bottom conductor level 517. In the illustrated example, which can be formed using a seven layer multilayer package substrate, the vertical inductor 508 can have an inductor height labeled "Indh" of 0.305 millimeters or 305 microns. Smaller height for the inductor can be obtained by using different layers as the upper layer 511 or the lower layer 517, and larger height can be obtained by using a multilayer package substrate that is thicker and/or that has more layers and thus more height is possible between layers. In an alternative example a multilayer package substrate having a thickness of 505 microns is used.

Figure 5B:
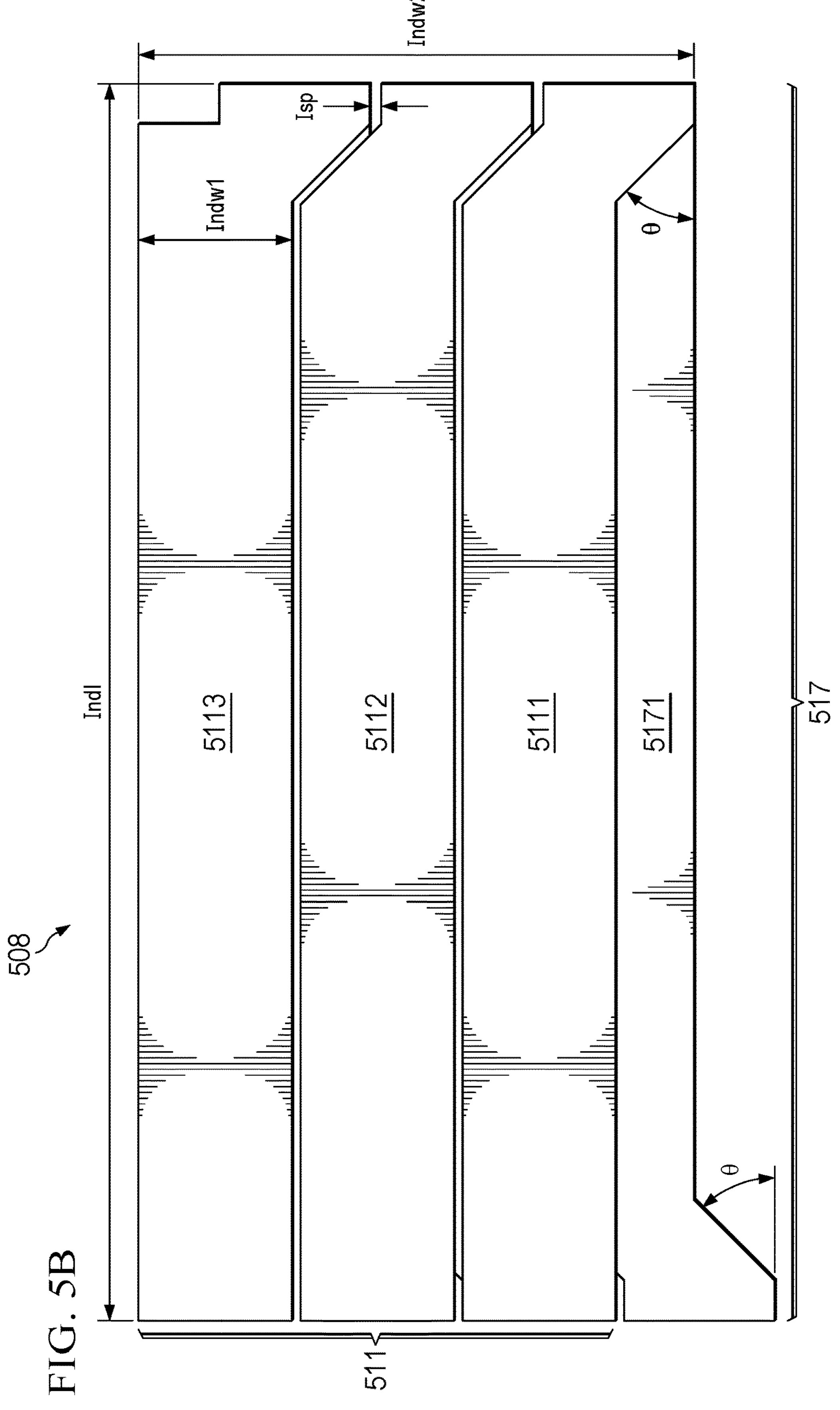
Figure 5C:
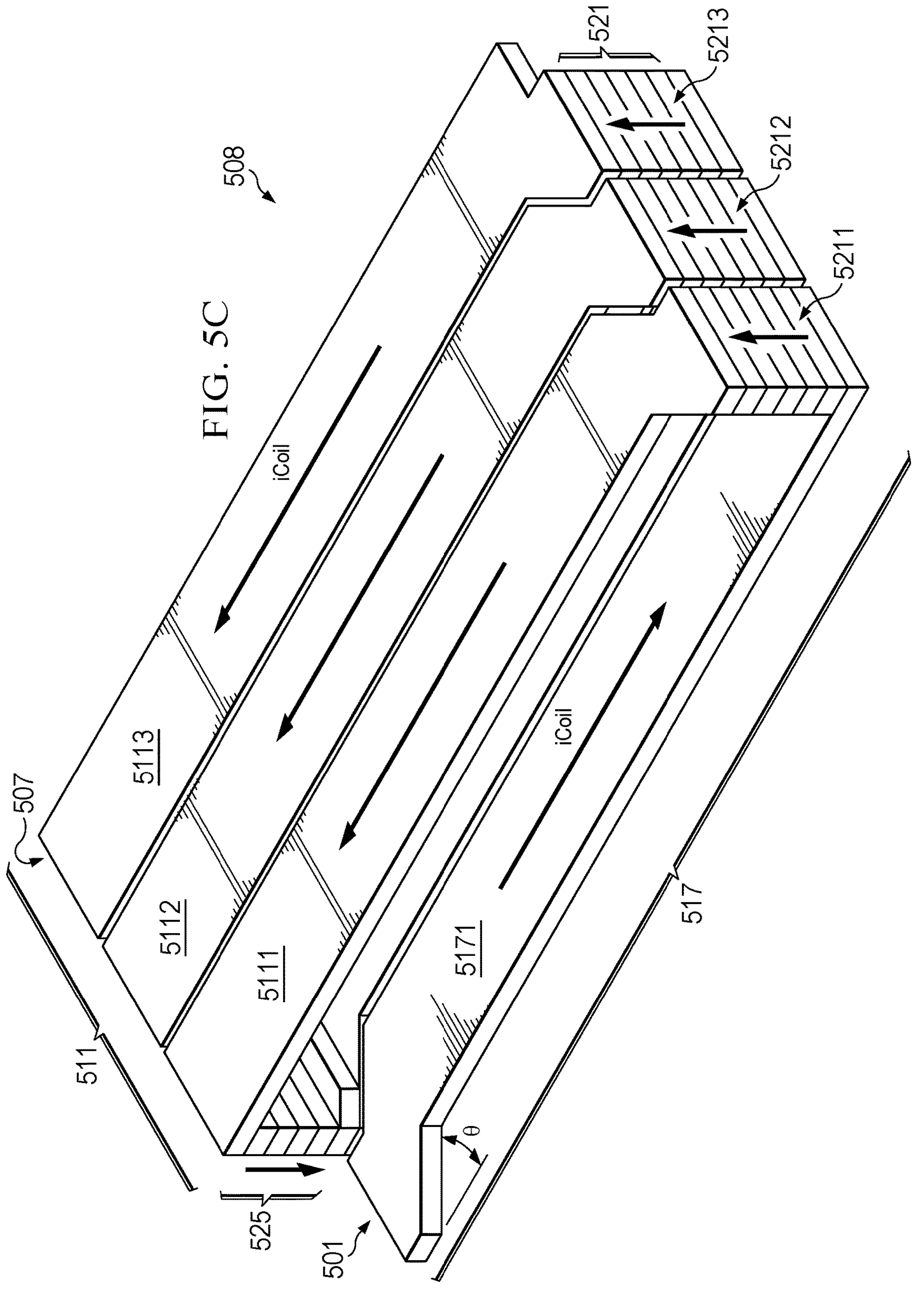
Figure 5D:
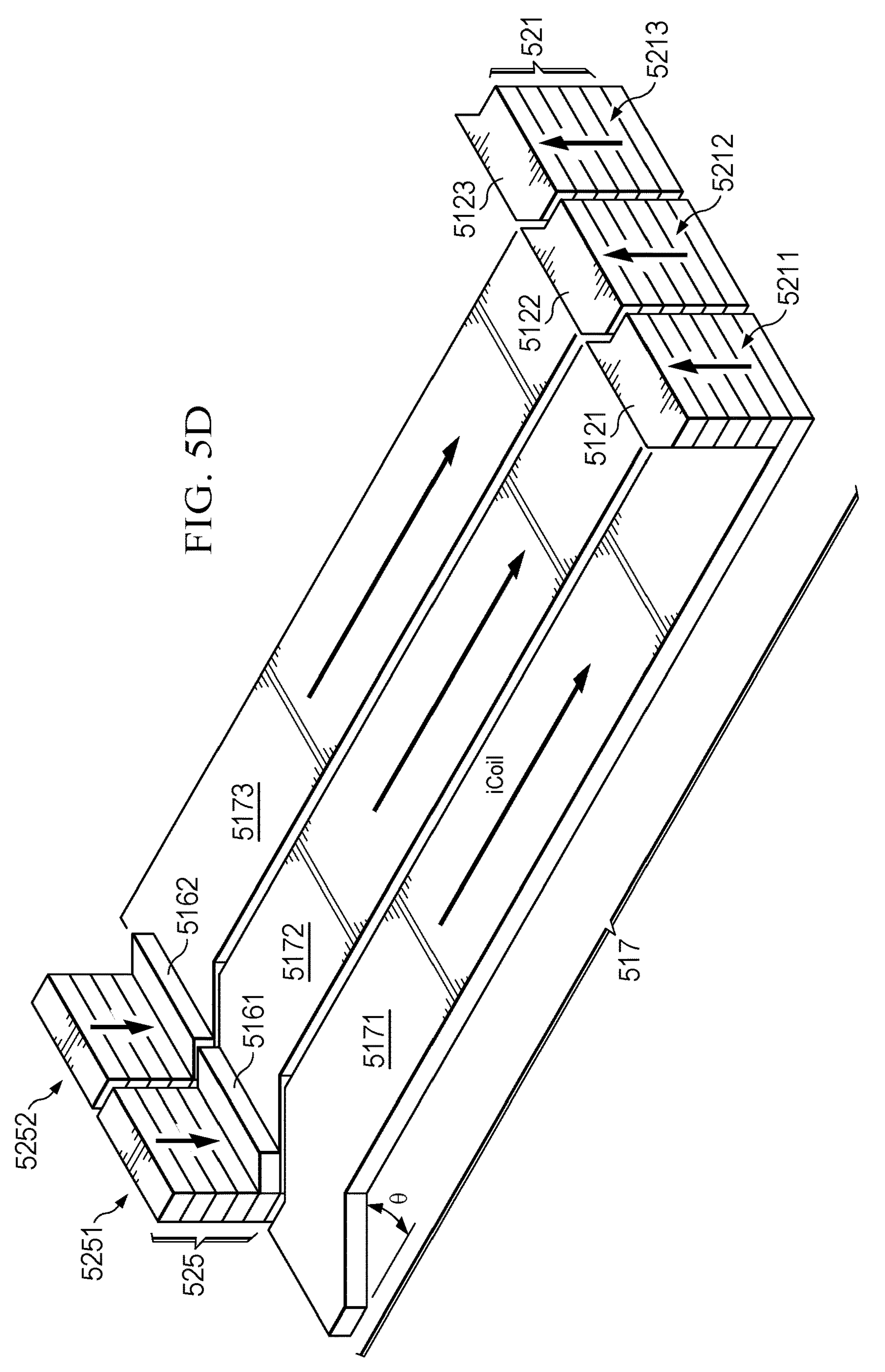

As shown in FIG. 5A, the example vertical inductor 508 has a rectangular shape (or in an alternative, a square shape) in the cross sectional view through the vertical inductor with the conductors surrounding a core 551. The core 551 of the example vertical inductor 508 is filled by the dielectric material of the multilayer package substrate such as ABF, ABS, or ASA. In a further alternative, a magnetic mold compound material can be used for the dielectric of the package substrate and the core 551 will also be formed of the magnetic material. In FIGS. 5B-5D the core material is omitted for simplicity of illustration.

FIG. 5B illustrates, in a top view, the vertical inductor 508 of FIG. 5A. The upper layer of conductor for the vertical inductor is formed of first conductor layer 511 with, in this example, three parallel strips 5113, 5112, 5111 each having an "in plane" jog at one end at an angle θ to a horizontal line, which can be 45 degrees. By jogging the parallel strips at one end, a continuous conductor for the vertical inductor 508 can be formed by connecting the parallel strips (5111, 5112, 5113) of the upper layer 511 to a corresponding parallel strip of the bottom layer 517 using vertical connections at the ends of the strips. The bottom layer 517 is shown in part in FIG. 5B with a parallel strip 5171 partly visible. The parallel strips in an example arrangement have a width labeled "Indw1" of 0.42 millimeters (mm). The parallel strips are spaced from one another by a spacing "Isp" of 0.02 mm. In an example arrangement, the vertical inductor 508 has a length labeled "Indl" of 3 millimeters, although larger and smaller dimensions can be used by patterning the conductors in the multilayer package substrate to obtain the desired sizes. The total width Indw2 is about 1.44 mm. The dimensions of the vertical inductor 508 are variable and many alternative arrangements can be formed by changing the strip width Indw1, the number of parallel strips, the height Indh, and the length Indl, to obtain a particular inductance for the vertical inductor.

FIG. 5C illustrates, in a projection view, the vertical inductor 508 of FIGS. 5A-5B. The upper conductor is formed of the first layer 511 patterned to form the three parallel conductor strips 5111, 5112 and 5113. The parallel conductor strips have the in plane jog or offset at one end to enable the strips 5111, 5112, and 5113 to be part of a continuous inductor. Vertical connections 521 and 525 are made between the first layer 511 to the corresponding parallel strips (a first bottom strip 5171 is visible in FIG. 5C, see more detail of the bottom conductor of layer 517 in FIG. 5D) of bottom conductor layer 517. Vertical connection 521 includes vertical connection strips 5211, 5212, and 5213, connecting the bottom conductor of layer 517 to the top conductor of layer 511, for each of the strips. Inductor current "iCoil" is shown flowing from a first terminal 501 at an end of the first bottom conductor strip 5171 of the bottom conductor layer 517. The current iCoil flows through a series of conductor portions in a serially connected continuous coil, traversing the vertical connection 5211, then the upper conductor strip 5111, then the vertical connection 525, which is also patterned into strips, (see 5171, 5172, and 5173 in FIG. 5D) to a second terminal 507. The vertical inductor 508 has a serial current conduction path between the first terminal 501 and the second terminal 507, and is a vertical inductor.

In the illustrated example, the vertical inductor 508 has a height of 0.305 millimeters (305 microns), and a length of about 3 millimeters. In an alternative example, where a multilayer package substrate having more layers is used, the height Indh is 0.505 millimeters (505 microns). In an example arrangement such as illustrated in FIGS. 5A-5D, with a height Indh of 305 microns, the L value for copper strips with the dimensions described was 5.7 nanohenry (nH) at DC, and for the example with the same dimensions for strip width Indw, length Indl, and a height of 505 microns, using the same process and materials, the L value obtained at DC was 8.79 nH.

FIG. 5D illustrates, in another projection view, the parallel strips 5171, 5172, and 5173, of the bottom conductor formed in layer 517, the vertical connections 525 and 521, with corresponding parallel strips (5251, 5252 for connection 525, and 5121, 5122, 5123 of connections 521. The parallel strips of the bottom conductor formed in layer 517 each have an angled jog portion at one end with an angle θ, which can be 45 degrees.

FIG. 5D also illustrates the optional partial vertical connections 5161, 5162 formed in layer 516, which are formed where the vertical connection 525 meets the bottom layer 517 to reduce current crowding affects, and the optional partial vertical connections 5121, 5122, 5123 that are formed in the layer 512 where the vertical connection 521 will meet the upper conductor (not shown in FIG. 5D) to reduce current crowding affects.

In an example arrangement without the partial vertical connections, the resistance measured at 400 MHz was 219.27 milliohms, in a same sized example formed including the partial vertical connections, the resistance at 400 MHz was 217.83 milliohms, and the current density observed with the partial vertical connection made to reduce the corner current crowding showed improved and more uniform current density through the structure. The inductor Q factor for the example with the partial vertical connections was increased from 56.25 without these optional features to 56.43 with the optional vertical connection features (measured at 400 MHz), and the Q factor increased for other lower frequency measurements as well.

Figure 6A:
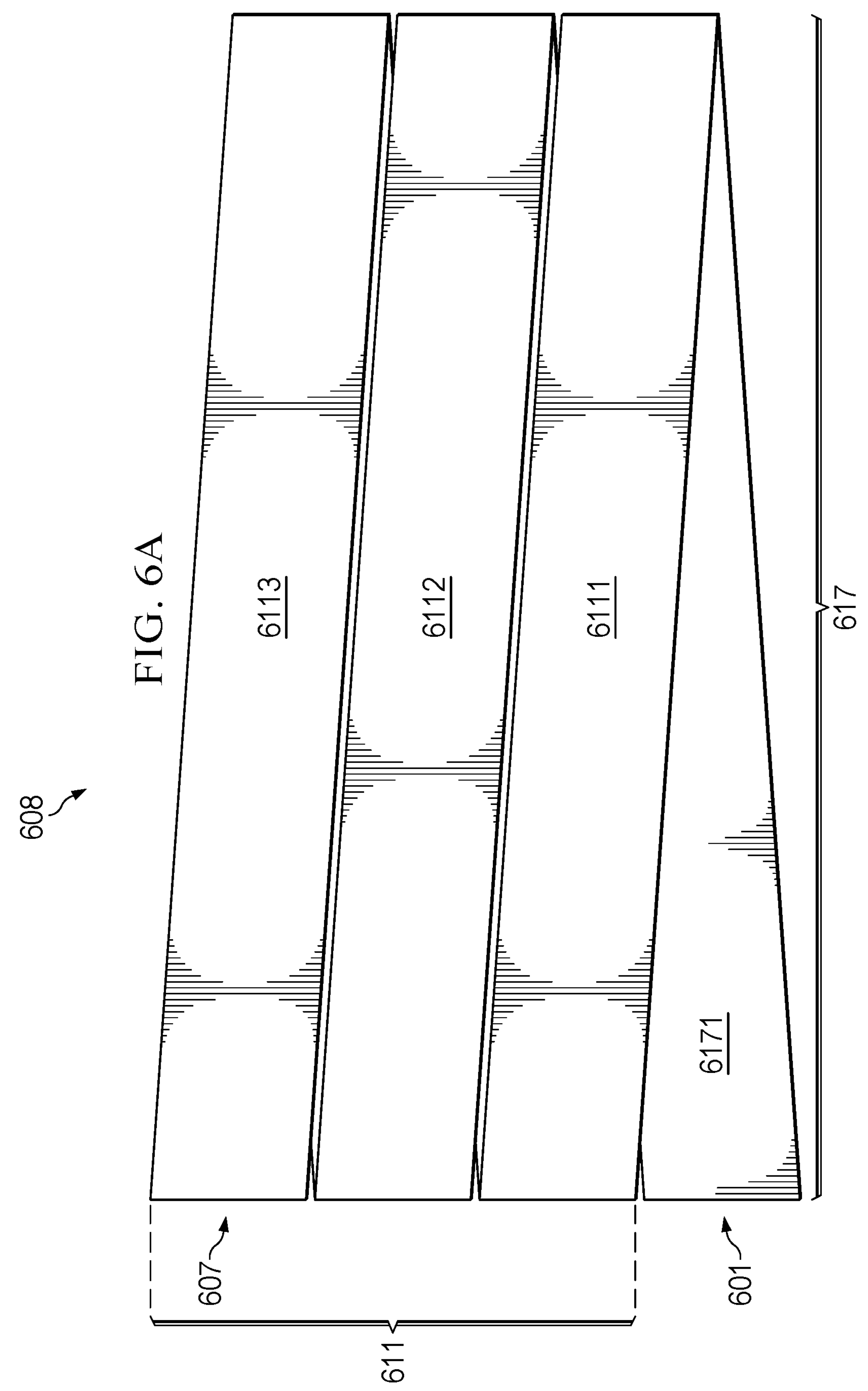
FIGS. 6A-6B illustrate, in a plan view and a projection view, an alternative vertical inductor for use with the arrangements.
Figure 6B:
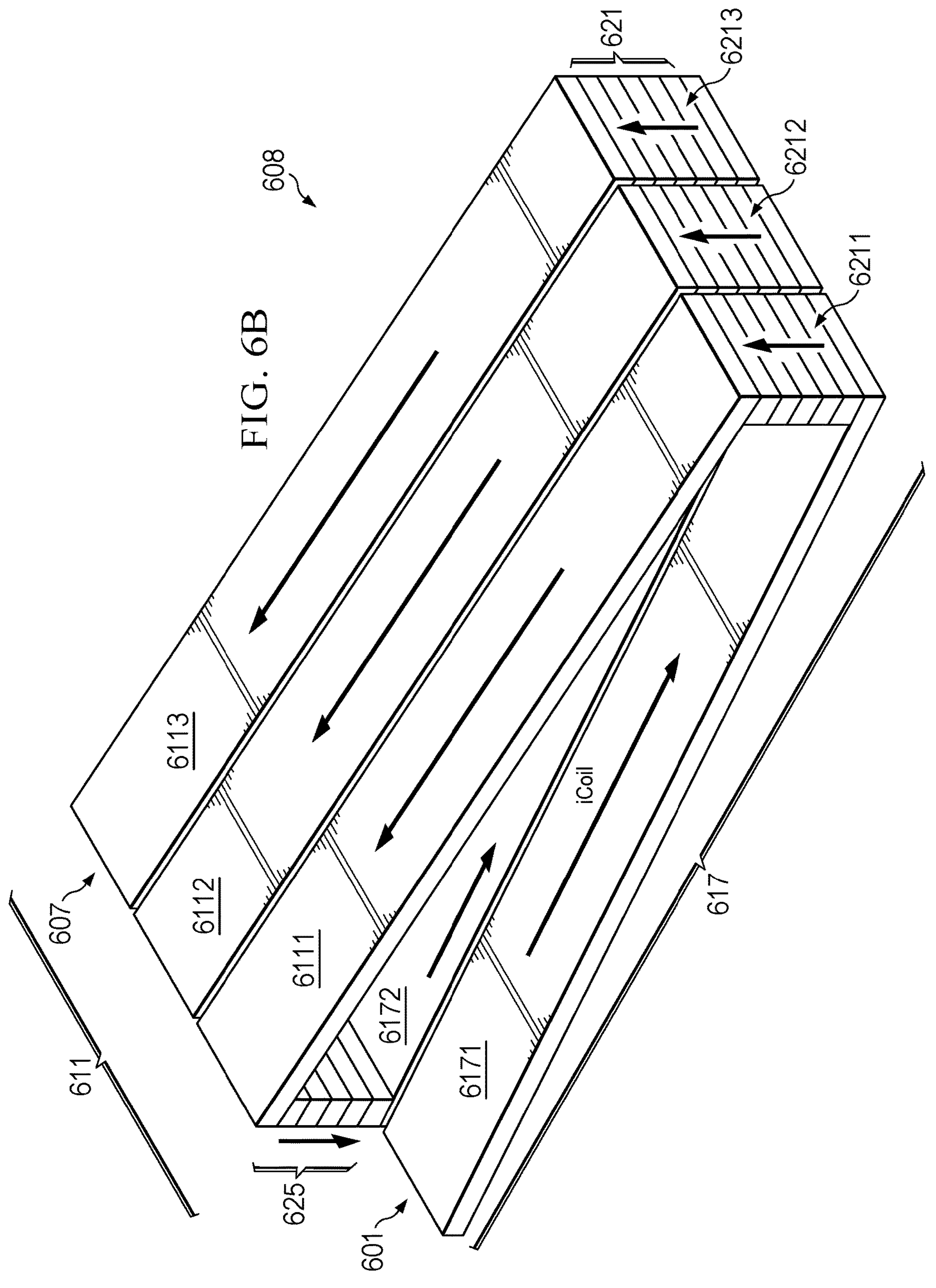

FIGS. 6A and 6B illustrate, in a plan view and in a projection, respectively, an alternative arrangement for a vertical inductor, only the conductor portions of a multilayer package substrate are shown for simplicity of illustration, the dielectric material is not shown. In one example the dielectric material is ABF, other thermoplastics such as ABS and ASA can be used. In another example the dielectric material is electronic mold compound (EMC). Magnetic mold compound can also be used to form the multilayer package substrate and will fill the core in the vertical inductor 608.

In FIG. 6A, the upper conductor is formed of a layer 611 of a multilayer package substrate that has parallel strips 6113, 6112, and 6113 patterned and set at an angle, and these parallel strips are formed over a bottom conductor formed of a layer 617 that is spaced from the upper conductor in the multilayer package substrate, a bottom strip 6171 is partially visible in FIG. 6A extending from beneath the upper conductors in the plan view. The vertical inductor 608 is formed with a single current path formed from the strips in upper conductor of layer 611 and the lower conductor of the layer 617 by making vertical connections (not visible in FIG. 6A) at each end of each parallel strip to form a continuous current path between an input terminal 601 and an output terminal 607 (note, these terminals can be reversed as the inductor 608 is a two terminal passive device). The parallel strips are angled to allow a continuous path by the use of vertical connections at each end of the strips to carry current on a lower strip, up to an upper strip, down to another bottom strip, and up to another vertical strip to connect the two terminals FIG. 6B illustrates the inductor 608 of FIG. 6A in a projection view. Again, the dielectric material between the conductor layers of the multilayer package substrate is not shown, for simplicity of illustration. In FIG. 6B, the lower conductor is formed of layer 617 of a multilayer package substrate, and the upper conductor is formed of layer 611 that is spaced from it. The vertical connection 621 at one end of the inductor 608 is formed by parallel stacks of the conductor layers of the multilayer package substrate, forming vertical connections 6211, 6212 and 6213. As the current iCoil traverses the inductor 608 from an input terminal 601 on one end of the lower strip 6171 to an output terminal 607 on the upper strip 6113, the current path is formed by a bottom strip (6171), is directed upwards on a first vertical connection strip (6211), is directed along a an upper strip 6111, is directed downwards on another vertical connection 625 (also having parallel strips, not visible in FIG. 6B), and the pattern continues with the parallel strips forming a continuous serial conduction path between the input terminal 601 and the output terminal 607.

In the illustrated example, the inductor 608 has the dielectric material (not shown in FIGS. 6A-6B) in the space between the upper conductor and the lower conductor. The dielectric material can be ABF, EMC, or a magnetic mold compound material used to form the package substrate and to form the core of the inductor 608.

The table 701 in FIG. 7 compares an arrangement such as shown in FIGS. 5A-5D with an inductor height of 305 microns (0.305 millimeters) (formed in a multilayer package substrate with a total height of 350 microns) to an arrangement as shown in FIGS. 5A-5D with an inductor height of 505 microns (0.505 millimeters) formed in a thicker multilayer package substrate and to a discrete inductor formed in a standalone package as a passive component. The measurements for resistance, inductance, and the Q factor, are shown for each of the inductors at DC, 10 MHz, 100 MHz, and 400 MHz frequencies.

As can be seen in FIG. 7, the vertical inductor of column 751 formed with an inductor height of 305 microns has a volume of 4.32 millimeters$^2$ by 0.305 millimeters (or 1.31 mm$^3$.) The inductor of column 753 formed with an inductor height of 505 microns has a volume of 4.32 millimeters$^2$*0.505 millimeters (or 2.16 mm$^3$.) The table of FIG. 7 includes measurements for a discrete square coil inductor with an air core, shown in column 755, which has a volume of 5.3 millimeters 2*2 millimeters (or 10.6 mm$^3$).

The Q factor (quality factor) of an inductor is given by the ratio of its inductive reactance to its resistance at a given frequency as shown in Equation 1:

$$Q = \frac{\omega L}{R} \qquad \text{Equation 1}$$

The resistance R for the vertical inductors of the arrangements are greater than for the discrete inductor (see Parasitic R for each column in FIG. 7). However, the volume needed for the inductors of the arrangements is far smaller, enabling the vertical inductors of the arrangements to be formed as part of the multilayer package substrate, and formed within a microelectronic device package with and coupled to an associated integrated circuit, increasing integration and ease of use, and reducing board area. The Q factor for the smaller inductor of the example arrangements, shown in the table in column 751, is 56.43, smaller than the Q factor of the discrete square air core inductor, column 755 in the table. However, the larger example inductor of the arrangements, as shown in column 753, has a Q factor of 87.03, which is quite comparable to the Q factor of the discrete inductor, 95.79, at 400 MHz. While the DC resistance for the vertical inductors of the arrangements is greater than the DC resistance for the discrete inductor, the resistance for both example arrangements 751, 753 are better than the discrete inductor example 755 at higher frequencies, which are comparable to an operating frequency for a DC-DC switching converter, for example. Use of the arrangements provides a lower cost, integrated inductor that is formed within the multilayer package substrate that is also used for packaging the integrated circuit. The vertical inductors of the arrangements are provided without the need for additional board area or complex packaging, while providing similar performance to the discrete inductors. Use of the vertical inductors also requires less area than would the use of prior planar inductors, reducing the size of the microelectronic device packages using the arrangements. In an application where the inductor is part of a switching noise filter, the increased resistance at DC (compared to a discrete component inductor) can be compensated for by tuning the routing traces to and from the vertical inductor, and it is noted that the switching noise filter is primarily directed to switching noise at higher frequencies, where the parasitic resistances of the vertical inductors of the arrangements are in fact lower than the parasitic resistances for the discrete inductor.

Figure 8:
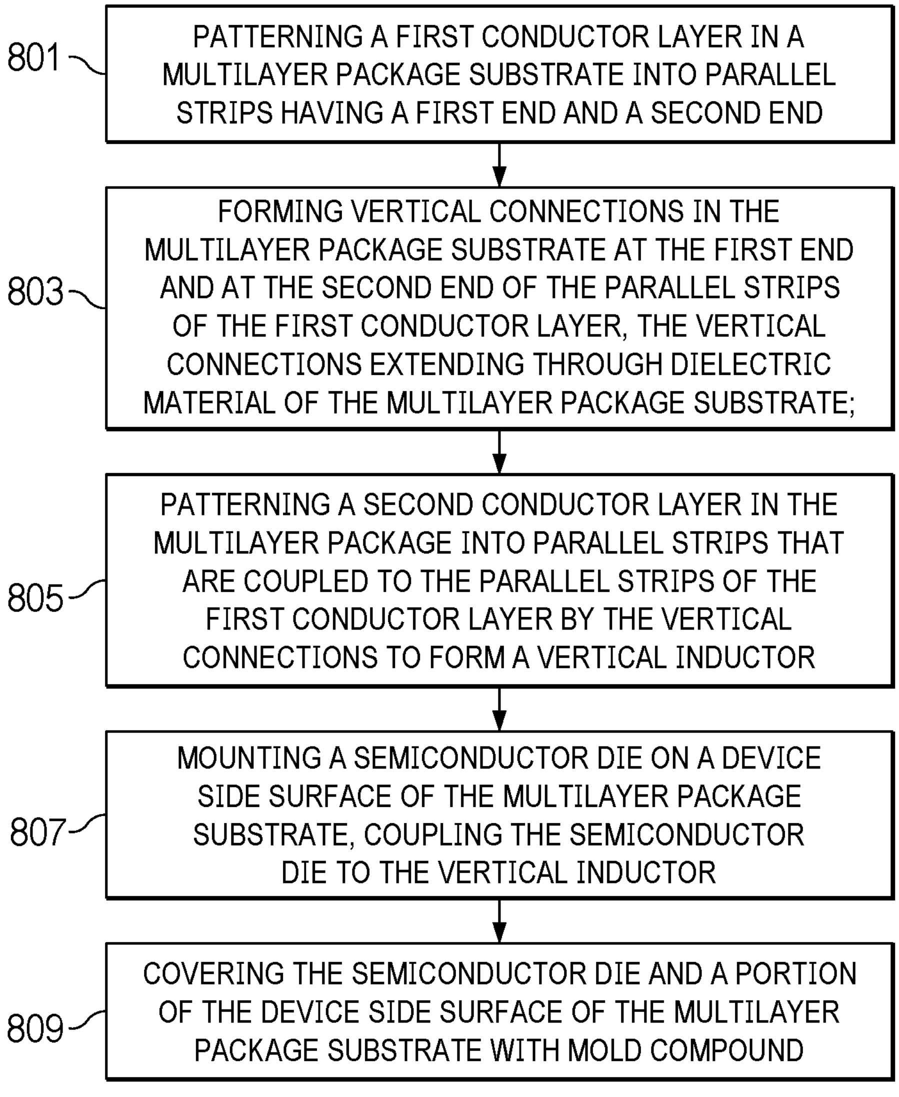
FIG. 8 illustrates, in a flow diagram, selected steps of a method for forming the arrangements.

FIG. 8 illustrates, in a flow diagram, steps for forming an arrangement. At step 801, a first conductor layer is patterned to form parallel strips having a first end and a second end in a multilayer package substrate, (see the projection of the vertical inductor 508 in FIG. 5D for example.) At step 803 the method continues by forming vertical connections at the first end and the second end of the parallel strips in the first layer (see vertical connections 5213, 5212, 5211 of FIG. 5C, for example). At step 805, the method continues by patterning a second conductor layer into parallel strips that are coupled to the parallel strips of the first conductor layer by the vertical connections (see layer 511 in FIG. 5A, for example). At step 807, a semiconductor die is mounted on the multilayer package substrate and at step 809, the semiconductor die and portions of the multilayer package substrate are covered with mold compound (see semiconductor die 102, on multilayer package substrate 104, and mold compound 103, shown in FIGS. 1A-1B, for example).

The use of the arrangements provides a microelectronic device package with an integrated vertical inductor and a semiconductor die. Existing materials and assembly tools are used to form the arrangements, and the arrangements are relatively low in cost when compared to solutions using additional circuit boards or modules to carry inductors. The arrangements are formed using existing methods, materials and tooling for making the devices and are cost effective.

Modifications are possible in the described arrangements, and other alternative arrangements are possible within the scope of the claims.

What is claimed is:

1. An apparatus, comprising:

a first conductor layer patterned into parallel strips having a first end and an opposite second end exposed from a device side surface of a multilayer package substrate, the multilayer package substrate comprising conductor layers spaced from one another by dielectric material and coupled to one another by conductive vertical connection layers extending through the dielectric material;

a second conductor layer in the multilayer package substrate spaced from the first conductor layer, the second conductor layer patterned into parallel strips having a first end and a second end, the second conductor layer coupled to the first conductor layer by vertical connectors formed of the conductive vertical connection layers to form an inductor; and a semiconductor die mounted to the device side surface of the multilayer package substrate that is spaced from and coupled to the inductor.

2. The apparatus of claim 1, wherein the inductor comprises a continuous current path through the conductor layers including the parallel strips of the first conductor layer and the parallel strips of the second conductor layer, and the vertical connectors.

3. The apparatus of claim 2, wherein the inductor comprises a continuous coil.

4. The apparatus of claim 1, wherein the parallel strips of the first conductor layer have an angled jog at the second end, the parallel strips of the second conductor layer have a corresponding angled jog at the first end, and the vertical connectors between the first conductor layer and the second conductor layer are connected with the parallel strips of the first conductor layer and the second conductor layer to form the inductor.

5. The apparatus of claim 1, wherein the parallel strips of the first conductor layer have an angle at the second end, the parallel strips of the second conductor layer have a corresponding angle at the first end, and the vertical connectors between the first conductor layer and the second conductor layer, the parallel strips of the first conductor layer, and the parallel strips of the second conductor layer are connected to form a continuous coil.

6. The apparatus of claim 1, wherein the semiconductor die is flip chip mounted to the device side surface of the multilayer package substrate, the semiconductor die having conductive post connects extending from the semiconductor die, the conductive post connects with a proximate end on a bond pad on the semiconductor die and extending to a distal end, and having a solder bump on the distal end, the solder bump forming a bond to the multilayer package substrate.

7. The apparatus of claim 1, wherein the semiconductor die is mounted to the device side surface of the multilayer package substrate with bond pads facing away from the device side surface of the multilayer package substrate, and having wire bonds coupling the bond pads to traces on the multilayer package substrate.

8. The apparatus of claim 1, wherein the inductor has a rectangular shape around a core of the dielectric material.

9. The apparatus of claim 1, wherein the semiconductor die and the device side surface of the multilayer package substrate are covered with mold compound.

10. The apparatus of claim 1, wherein the dielectric material comprises Ajinomoto Build up Film (ABF), acrylonitrile butadiene styrene (ABS), acrylonitrile styrene acrylate (ASA), epoxy resin mold compound, or magnetic mold compound.

11. The apparatus of claim 1, wherein the conductor layers comprise copper, gold, aluminum, silver, or an alloy thereof.

12. A microelectronic device package, comprising:

a multilayer package substrate comprising conductor layers spaced from one another by dielectric material, and comprising vertical connections extending through the dielectric material between the conductor layers and coupling between portions of the conductor layers, the multilayer package substrate having a device side surface and an opposite board side surface;

an inductor formed by a first one of the conductor layers exposed from the device side surface and a second one of the conductor layers that is spaced from the first one of the conductor layers, and having the vertical connections between the first one of the conductor layers and the second one of the conductor layers;

a semiconductor die mounted to the device side surface and coupled to the inductor; and mold compound covering the semiconductor die and a portion of the device side surface.

13. The microelectronic device package of claim 12, wherein the inductor comprises a current path formed of strips of the first one of the conductor layers, strips of the second one of the conductor layers, and the vertical connections.

14. The microelectronic device package of claim 13, wherein the inductor comprises a continuous coil.

15. The microelectronic device package of claim 12, wherein the first one of the conductor layers has parallel strips having a first end and an angled jog at a second end, the second one of the conductor layers has parallel strips having a first end with an angled jog and a second end, and the vertical connections between the first one of the conductor layers and the second one of the conductor layers, the parallel strips of the first one of the conductor layers, and the parallel strips of the second one of the conductor layers form a continuous coil.

16. The microelectronic device package of claim 12, wherein the first one of the conductor layers has parallel strips having a first end and an angle at a second end, the second one of the conductor layers has parallel strips having an angle at a first end and a second end, and the vertical connections between the first one of the conductor layers and the second one of the conductor layers, the parallel strips of the first one of the conductor layers, and the parallel strips of the second one of the conductor layers form a continuous coil.

17. The microelectronic device package of claim 12, wherein the semiconductor die is flip chip mounted to the device side surface, the semiconductor die having conductive post connects extending from the semiconductor die, the conductive post connects with a proximate end on a bond pad on the semiconductor die and extending to a distal end away from the semiconductor die, and having a solder bump on the distal end, the solder bump forming a bond to the multilayer package substrate.

* * * * *